United States Patent
Tutt et al.

(10) Patent No.: US 6,811,938 B2
(45) Date of Patent: Nov. 2, 2004

(54) USING FIDUCIAL MARKS ON A SUBSTRATE FOR LASER TRANSFER OF ORGANIC MATERIAL FROM A DONOR TO A SUBSTRATE

(75) Inventors: Lee W. Tutt, Webster, NY (US); Mark D. Bedzyk, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 184 days.

(21) Appl. No.: 10/230,934

(22) Filed: Aug. 29, 2002

(65) Prior Publication Data

US 2004/0048173 A1 Mar. 11, 2004

(51) Int. Cl.[7] .............................. G03F 9/00; G03C 5/04
(52) U.S. Cl. ........................... 430/22; 430/30; 430/200
(58) Field of Search ............................... 43/22, 30, 200

(56) References Cited

U.S. PATENT DOCUMENTS

| 5,578,416 A | 11/1996 | Tutt |
| 5,688,551 A | 11/1997 | Littman et al. |
| 5,742,129 A | 4/1998 | Nagayama et al. |
| 5,851,709 A | 12/1998 | Grande et al. |
| 5,937,272 A | 8/1999 | Tang |
| 6,114,088 A | 9/2000 | Wolk et al. |
| 6,140,009 A | 10/2000 | Wolk et al. |
| 6,194,119 B1 | 2/2001 | Wolk et al. |
| 6,214,520 B1 | 4/2001 | Wolk et al. |
| 6,221,553 B1 | 4/2001 | Wolk et al. |
| 6,682,863 B2 * | 1/2004 | Rivers et al. ................. 430/22 |

FOREIGN PATENT DOCUMENTS

EP   1 028 001 A1   8/2000

\* cited by examiner

*Primary Examiner*—Christopher G. Young
(74) *Attorney, Agent, or Firm*—Raymond L. Owens

(57) ABSTRACT

A method of aligning a substrate for use in manufacture of OLED displays with a laser which produces a beam that causes the transfer of organic material from a donor element to the substrate, including providing at least one fiducial mark on the substrate; positioning the substrate relative to the laser and providing relative movement between the substrate and the laser and the laser beam until the laser beam impinges upon the fiducial mark; and detecting when the laser beam impinges upon the fiducial mark and determining the position and orientation of the substrate.

21 Claims, 6 Drawing Sheets

USING FIDUCIAL MARKS ON A SUBSTRATE FOR LASER TRANSFER OF ORGANIC MATERIAL FROM A DONOR TO A SUBSTRATE

CROSS REFERENCE TO RELATED APPLICATIONS

Reference is made to commonly assigned U.S. patent application Ser. No. 10/184,417 filed Jun. 27, 2002 by Andrea S. Rivers et al., entitled "Depositing an Emissive Layer for Use in an Organic Light-Emitting Display Device (OLED)"; commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer", and commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device", the disclosures of which are herein incorporated by reference.

FIELD OF THE INVENTION

The present invention relates to making organic light emitting devices (OLED) which transfers organic material from a donor to a substrate.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium may consist of one or more layers of organic thin films, where one of the layers is primarily responsible for light generation or electroluminescence. This particular layer is generally referred to as the emissive layer of the organic EL medium. Other organic layers present in the organic EL medium may provide electronic transport functions primarily and are referred to as either the hole transport layer (for hole transport) or electron transport layer (for electron transport). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, it is challenging to align the substrate and the shadow mask, such that pixels are formed in the appropriate locations. When it is desirable to increase the substrate size, it is increasingly difficult to manipulate the shadow mask as part of the alignment process to form appropriately positioned pixels. A further disadvantage of the shadow mask method is that the mask holes can become plugged with time. Plugged holes on the mask lead to the undesirable result of nonfunctioning pixels on the EL display.

There are further problems with the shadow mask method, which become especially apparent when making EL devices with dimensions of more than a few inches on a side. It is extremely difficult to manufacture larger shadow masks with the required precision for accurately forming EL devices.

A method for patterning high-resolution organic EL displays has been disclosed in U.S. Pat. No. 5,851,709 by Grande et al. This method is comprised of the following sequences of steps: 1) providing a substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. A series of patents by Wolk et al. (U.S. Pat. Nos. 6,114,088; 6,140,009; 6,214,520; and 6,221,553) teach a method that can transfer the luminescent layer of an EL device from a donor sheet to a substrate by heating selected portions of the donor with laser light. Wolk et al. comments that the use of light may be the preferred thermal transfer modality, in that it enables the precision registration needed in the manufacture of large scale devices. While laser thermal transfer does enable precision registration, it is essential that the beam of light be aligned and directed such that the correct regions of the substrate receive transferred donor material. Other means of thermal transfer would also depend upon means of precision alignment between the substrate and the thermal transfer means.

SUMMARY OF THE INVENTION

It is an object of the present invention to provide a more effective way of aligning a substrate with a laser beam, which is independent of thermal expansion of the substrate.

It is another object of the present invention to minimize the number of alignment steps needed to properly align the laser and the substrate.

These objects are achieved by a method of aligning a substrate for use in manufacture of OLED displays with a laser which produces a beam that causes the transfer of organic material from a donor element to the substrate, comprising the steps of:

(a) providing at least one fiducial mark on the substrate;

(b) positioning the substrate relative to the laser and providing relative movement between the substrate and the laser and the laser beam until the laser beam impinges upon the fiducial mark; and (c) detecting when the laser beam impinges upon the fiducial mark and determining the position and orientation of the substrate.

ADVANTAGES

It is an advantage of the present invention that, by providing fiducial mark(s) on a substrate, an effective way of determining the position and orientation of the substrate can be accomplished prior to transfer of the organic materials. It is a further advantage of the present invention that the same laser beam which is used for transfer from a donor element to the substrate can also be used to determine the position and orientation of the substrate relative to the laser. Alignment in accordance with the present invention is highly accurate and is provided by a direct detection of the fiducial marks. A further advantage of the present invention is that highly accurate alignment information can be developed with a minimum number of steps. Another advantage of the present invention is that it permits the automatic alignment of the laser beam to transfer material to different pixel sites.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" or "OLED display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any hue or combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1A:
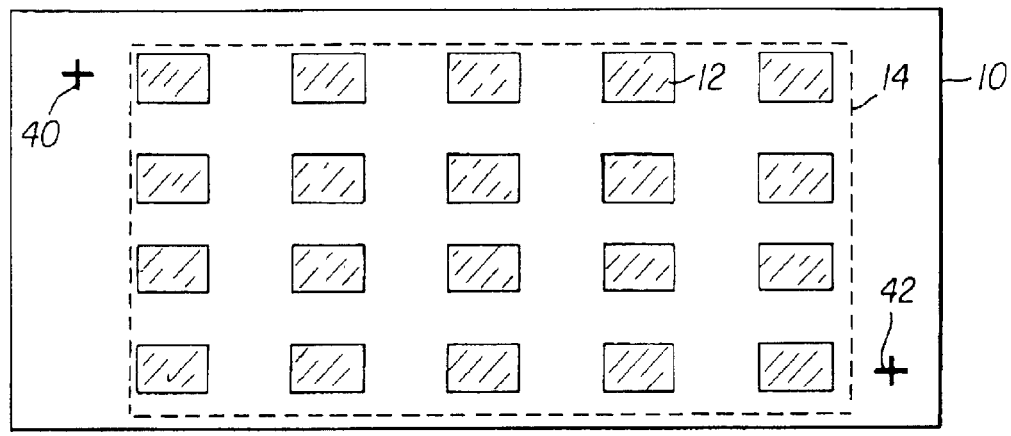
FIG. 1a is a top view of an OLED substrate constructed in accordance with the present invention.

Turning now to FIG. 1a, there is shown a top view of an OLED substrate 10 constructed in accordance with this invention. OLED substrate 10 includes an array of pixel portions 12. Such pixel portions 12 are each associated with electrodes and can be part of a so-called passive display which has overlapping rows and columns of electrodes, or part of an active display which has a common anode and individual thin-film transistors (TFTs). Each pixel portion 12 can be a pixel (for monochrome displays) or sub-pixel (for full-color displays). The distance between individual pixels or sub-pixels can be desired to be less than 100 micrometers in such devices.

Substrate 10 can be an organic solid, an inorganic solid, or a combination of organic and inorganic solids that provides a surface for receiving the emissive material from a donor. Substrate 10 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 10 can be a homogeneous mixture of materials, a composite of materials, or multiple layers of materials. Substrate 10 can be an OLED substrate, that is a substrate commonly used for preparing OLED displays, e.g. active-matrix low-temperature polysilicon TFT substrate. The substrate 10 can either be light transmissive or opaque, depending on the intended direction of light emission and fiducial detection. The light transmissive property is desirable for viewing the EL emission through the substrate and for viewing a laser spot through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. For the purpose of this invention, substrate 10 is preferably an OLED substrate and the terms "substrate" and "OLED substrate" will be used interchangeably.

FIG. 1a additionally shows fiducial marks 40 and 42 on substrate 10. Fiducial marks are features on substrate 10 which are detectable by a means, e.g. optically, and are usable for determining the position and orientation of substrate 10 for properly depositing the emissive layer relative to pixel portions 12 in a manner which will be evident. These features, which are the fiducial marks, may have other purposes, such as being part of an active or passive matrix. One or more fiducial marks are formed in known positions of substrate 10. Fiducial marks 40 and 42 are preferably outside material transfer area 14, which is the area where the organic material is to be transferred onto substrate 10 to form one or more OLED displays. Fiducial marks 40 and 42 are designed to enable the identification of a specific point on substrate 10 and can have a specified shape, which can include intersecting crosshairs, a triangle, a cross, a circle, a square, intersecting triangles, an "X", or any other shape that can be utilized to define a point. A fiducial mark should not be infinitely rotationally symmetric (e.g. a circle or a bullseye) unless a second fiducial mark is to be used. A single fiducial mark can be partially rotationally symmetric, such that the extent of rotational symmetry would cause substantial substrate misalignment that is obvious even to the naked eye (e.g. a cross, which is rotationally symmetric at 90° intervals). In a preferred embodiment the fiducial mark 40 is a cross, although it is realized that any non- or limited-rotationally symmetric mark can allow the rotational position to be determined. For greater accuracy, a preferred embodiment is to provide two fiducial marks 40 and 42, each such mark having a specified shape such as a cross, on substrate 10 and separated by a distance of at least 50% of the length of substrate 10. Each fiducial mark is located above a light detector.

Figure 1B:
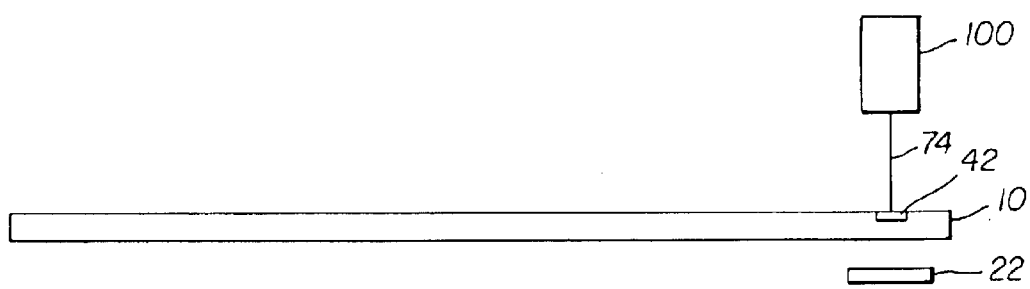
FIG. 1b is a cross-sectional representation of the positioning of a substrate relative to a laser.

FIG. 1b shows a cross-sectional representation of the positioning of a substrate 10 relative to a laser 100, which produces laser beam 74. In this embodiment, substrate 10 is positioned between laser 100 and light detector 22 so that by providing relative movement between substrate 10 and laser 100 and laser beam 74, laser beam 74 can impinge upon fiducial mark 42. Light detector 22 can detect when laser beam 74 impinges upon fiducial mark 42.

Figure 2:
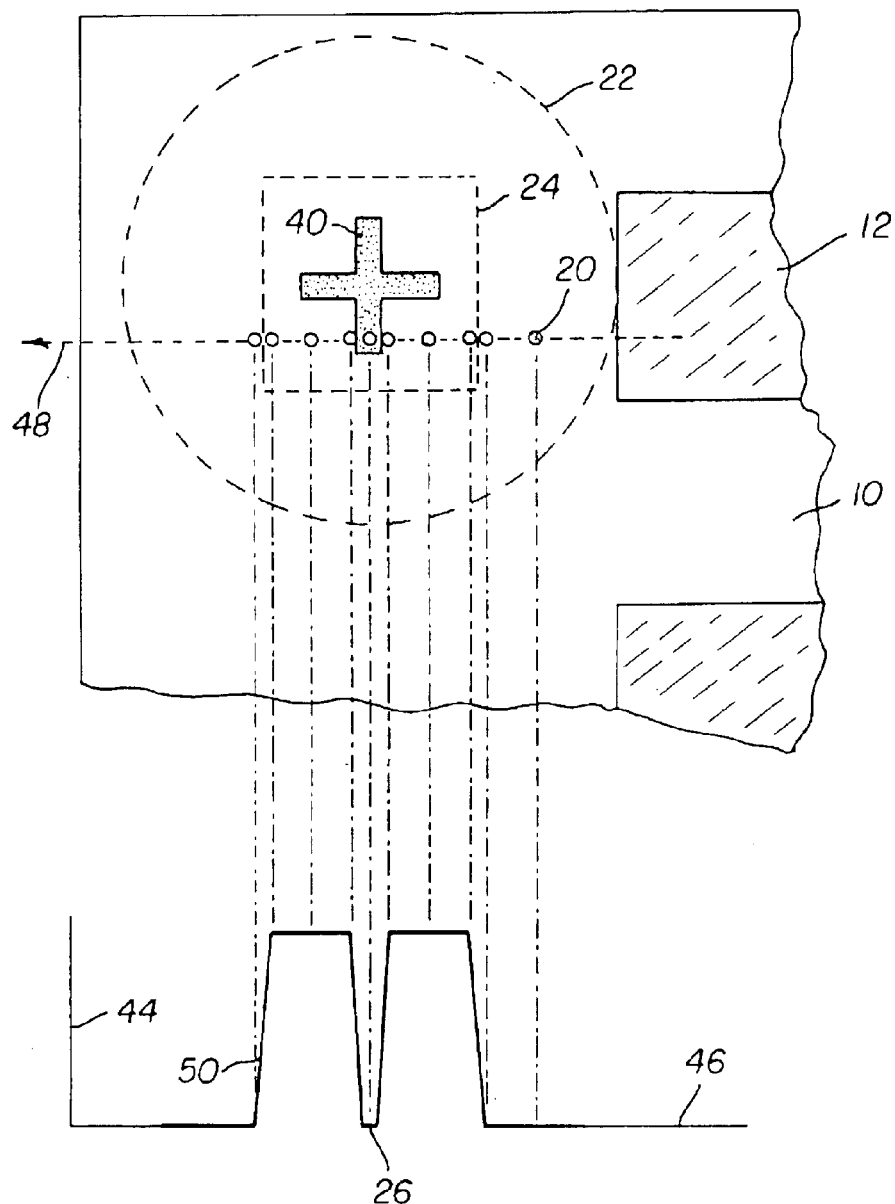
FIG. 2 is an expanded top view of a portion of the above substrate showing fiducial marks and the position of a photodetector and laser spot.

FIG. 2 shows an expanded top view of a portion of substrate 10 showing fiducial mark 40 and the position of light detector 22 and laser spot 20. Light detector 22 can be e.g. a photodetector. Light detector 22 includes light detector active area 24, which is the part of light detector 22 that is sensitive to impinging light, such as that provided by laser spot 20. In this particular embodiment, light detector 22 is located below substrate 10 and substrate 10 is sufficiently transparent such that sufficient light passes through substrate 10 to be detected by light detector 22. By providing relative movement between the substrate 10 and the laser 100 and the laser beam 74, the position and orientation of fiducial mark 40 can be detected. By relative movement is meant movement of one or more parts of this apparatus such that the positions of laser spot 20, substrate 10, and light detector 22 are changed relative to one another. This can be achieved by a variety of methods, such as moving laser spot 20, moving substrate 10, moving both laser spot 20 and light detector 22, etc. Providing relative movement in a raster scanning method, that is a two-dimensional sequence of scan lines, allows one to build an image of fiducial mark 40. In the preferred embodiment wherein the fiducial mark is a cross, the angular rotation of fiducial mark can be deduced from the angle between the scan line and the horizontal line of the plus sign.

In a preferred embodiment employing two fiducial marks 40 and 42, the angle of rotational misalignment can be determined more accurately than with a single fiducial mark by virtue of the increased distance between the two fiducial marks. This is accomplished by measuring the center of both fiducial marks 40 and 42 and calculating the angle formed the laser spot scan 48 and the line between the fiducial marks. This angle can then be compared to the desired orientation and appropriate adjustments made. Knowing the center of the fiducials also allows one to obtain the relative x, y displacement relative to a desired location and appropriate translation of the substrate or, alternatively, modification of the image file such that image placement is now rotationally and translationally correct, in a manner that has been described in commonly assigned U.S. Pat. application Ser. No. 10/184,417 filed Jun. 27, 2002 by Andrea S. Rivers et al., entitled "Depositing an Emissive Layer for Use in an Organic Light-Emitting Display Device (OLED)", the disclosure of which is herein incorporated by reference.

Other embodiments are also possible. For example, both light detector 22 and laser spot 20 can be on the same side, that is, above substrate 10. In this case, substrate 10 need not be transparent, and light detector 22 detects reflected light from the surface of substrate 10.

FIG. 2 additionally shows the relative strength of light detector signal intensity 50 in relation to relative light detector position 46. Relative movement causes the apparent position of laser spot 20 to change so that laser beam 74 impinges upon fiducial mark 40 in multiple locations, as shown by laser spot scan 48. Light detector signal intensity 50, as measured by signal strength 44, is strong in the region of light detector active area 24, unless diminished by fiducial mark 40. Light detector 22 can detect when laser beam 74 impinges upon fiducial mark 40 by the change in light detector signal intensity 50. Information, such as light detector signal intensity 50 with respect to relative light detector position 46, can be recorded or computed from the detection of fiducial marks such as 40. Thus, it is possible to determine the position of fiducial center 26 in the first direction. By techniques such as additional laser spot scans, it is possible to determine the position of the center of fiducial mark 40 in a second perpendicular direction. Recorded information can be used to calculate the orientation and position of substrate 10 in a manner described in commonly assigned U.S. patent application Ser. No. 10/184, 417 filed Jun. 27, 2002 by Andrea S. Rivers et al., entitled "Depositing an Emissive Layer for Use in an Organic Light-Emitting Display Device (OLED)", the disclosure of which is herein incorporated by reference.

Figure 3:
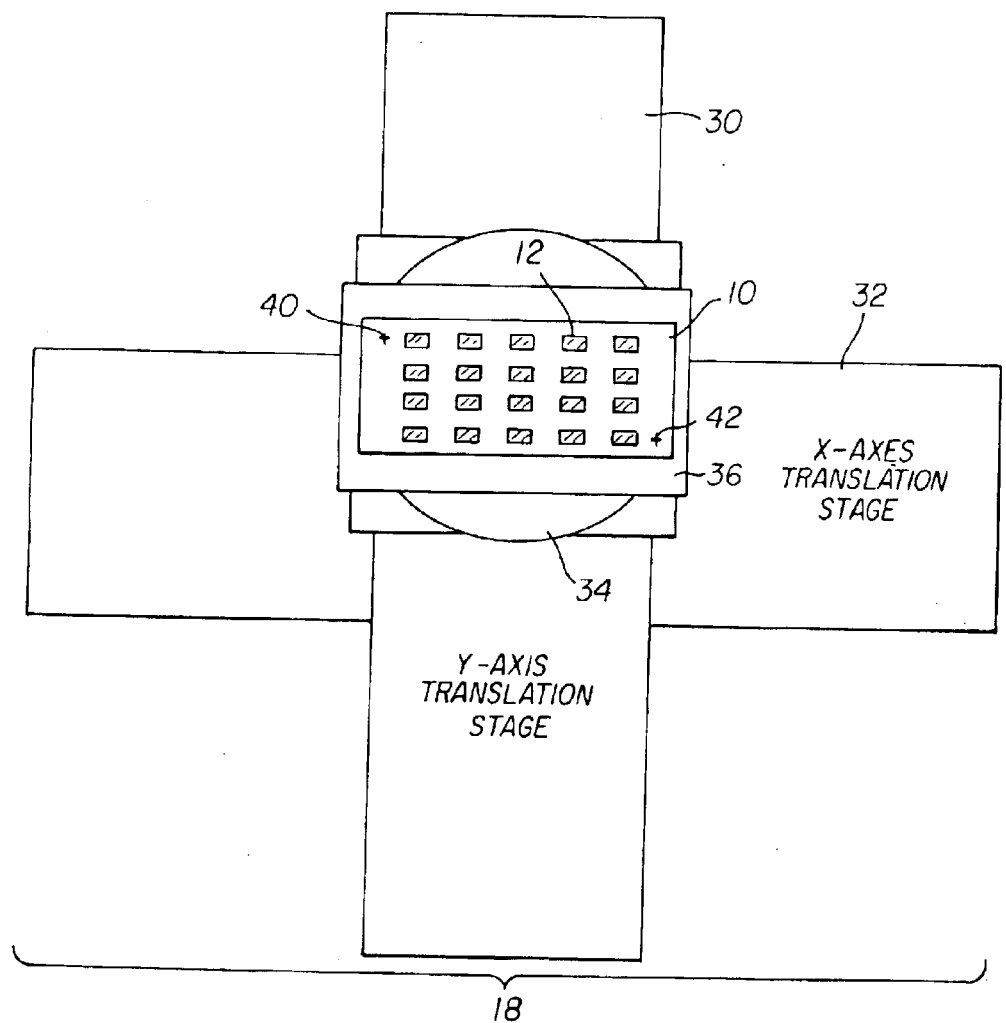
FIG. 3 shows one embodiment of an apparatus providing relative movement that enables the method described herein.

Turning now to FIG. 3 there is shown one embodiment of an apparatus 18 providing relative movement between substrate 10 and the laser 100 and the laser beam 74 that enables the method described herein. The apparatus 18 includes apparatus to move substrate 10, that is, y-axis translation stage 30, x-axis translation stage 32, and rotation stage 34 with hold-down platen 36. Hold-down platen 36 includes light detectors 22, which are not shown for clarity. Laser 100, which is not shown, is located in a fixed position above hold-down platen 36 and substrate 10.

Substrate 10 is transversely and angularly movable to selected positions to provide relative movement between laser spot 20 and substrate 10 in a manner which will now be described. Substrate 10 is mounted on hold-down platen 36 which can be, for example, a vacuum hold-down apparatus. Laser spot 20 can be from, for example, a laser printhead as taught by commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer", the disclosure of which is herein incorporated by reference. X-axis translation stage 32 is capable of moving and locating substrate 10 in a transverse direction with a resolution on the order of micrometers. X-axis translation stage 32 is commercially available from manufacturers such as Dover Instruments Corp. X-axis translation stage 32 can adjust for lateral displacement in one direction, thus making substrate 10 transversely movable to adjust the position of laser spot 20 in relation to substrate 10.

X-axis translation stage 32 is mounted to y-axis translation stage 30. The latter is similar to, but arranged in a manner orthogonal to x-axis translation stage 32, and is thus capable of moving x-axis translation stage 32, and by extension substrate 10, in a perpendicular direction, with a resolution on the order of micrometers.

Mounted to x-axis translation stage 32 is rotation stage 34. Rotation stage 34 allows angular adjustment of hold-down platen 36 and substrate 10, thus angularly moving substrate 10.

Figure 4A:
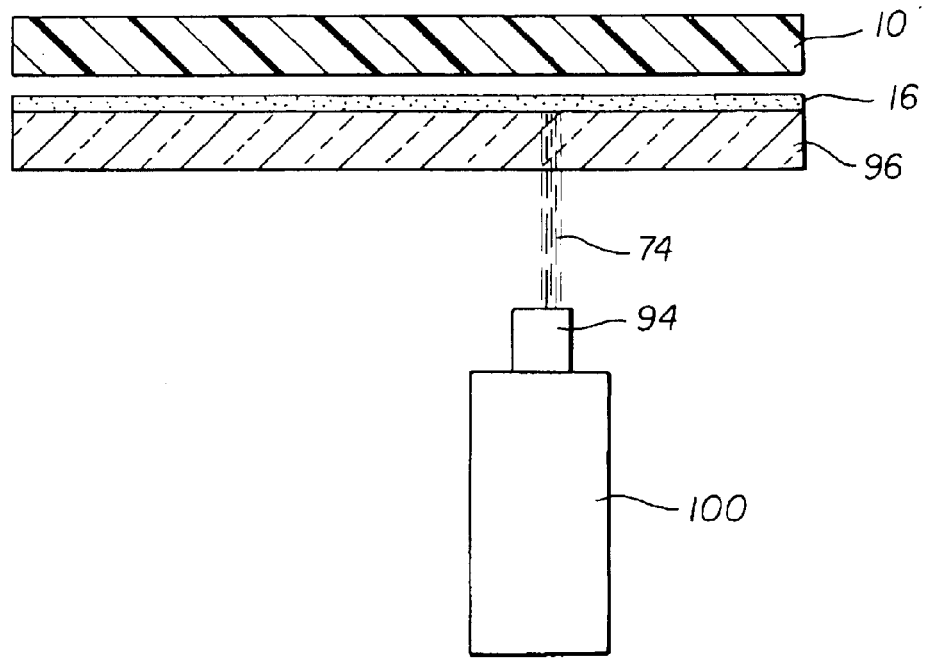
FIG. 4a shows a cross-sectional view of a laser irradiating a secured substrate/donor element combination with a beam of light in accordance with this invention.

FIG. 4a shows a cross-sectional view of laser 100 irradiating a secured substrate/donor element combination with a beam of light in accordance with this invention. Laser 100 can be a multichannel laser which emits a modulated multichannel linear laser light beam, the use of which has been described in commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer", the disclosure of which is herein incorporated by reference. The translation stages are not shown for clarity. Donor element 16 is positioned between laser 100 and substrate 10 in a transfer relationship with substrate 10, that is, donor element 16 is placed in contact with substrate 10 (not shown), or is held with a controlled separation from substrate 10. Donor element 16 is held in position by pressurizing means 96. Pressurizing means 96 can be a transparent support or can be a chamber that is pressurized with gas to secure donor element 16 in a close relationship with substrate 10, as taught by commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device", the disclosure of which is herein incorporated by reference.

Laser 100 emits laser beam 74 which can be multichannel, that is to say multiple modulated channels of a linear laser light beam, through print lens 94. Laser beam 74 is drawn for clarity of illustration as a series of lines to emphasize that it can be multichannel in nature as a plurality of individually addressable channels of laser light. It will be understood that these channels can be contiguous and behave on irradiation as a continuous band of laser light. Laser beam 74 can be directed onto donor element 16 through pressurizing means 96, which is transparent, and strikes the non-transfer surface of donor element 16. A desired pattern can be obtained by modulating laser beam 74 while providing relative motion between laser 100 and substrate 10.

Figure 4B:
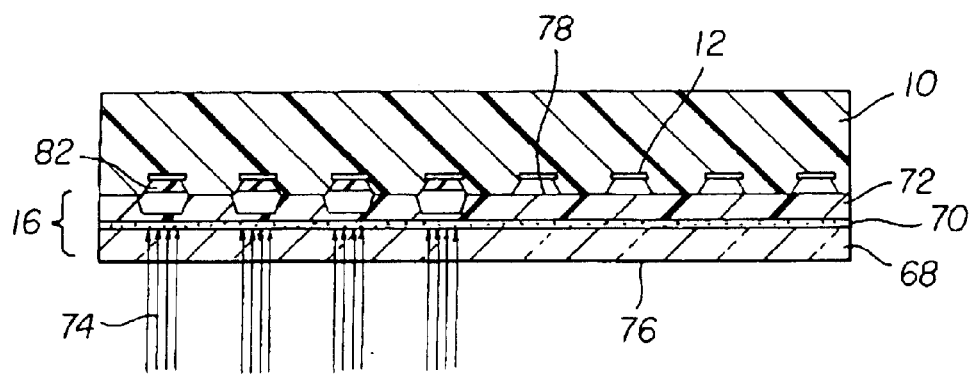
FIG. 4b shows a cross-sectional view of an OLED substrate and a donor element properly positioned relative to the substrate in the practice of this invention.

Turning now to FIG. 4b, there is shown a cross-sectional view showing an OLED substrate and a donor element properly positioned relative to the substrate in the practice of this invention. Donor element 16 and substrate 10 are in a transfer relationship, that is, donor element 16 is placed on or close to substrate 10. Donor element 16 includes support 68, energy-absorbing layer 70, and a layer of organic material 72. Donor element 16 is unpatterned, that is, energy-absorbing layer 70 and organic material 72 are coated evenly on the surface of support 68. Organic material 72 is transferred from transfer surface 78 of donor element 16 to substrate 10 by selective irradiation of non-transfer surface 76 of donor element 16 by laser beam 74, which is absorbed by and heats selected portions of energy-absorbing material 70 and thereby heats selected portions of organic material 72. Selective irradiation is accomplished by providing relative movement between laser beam 74 and substrate 10, and activating laser beam 74 in accordance with the determined position and orientation of substrate 10 to cause the transfer of organic material 72 from donor element 16 onto substrate 10 at the desired positions, e.g. pixel portions 12. Laser beam 74 can be activated according to timing or according to position. The selected portions of organic material 72 are vaporized or sublimed to become organic layer 82 upon transfer to substrate 10.

Energy-absorbing layer 70 does not permit laser beam 74 to pass through to substrate 10. In one embodiment, aligning substrate 10 can be done before placing donor element 16 onto substrate 10. In another embodiment, donor element 16 does not include energy-absorbing layer 70 in the region of fiducial marks 40 and 42 and therefore is sufficiently transparent in the region of fiducial marks 40 and 42 so that donor element 16 permits sufficient light to pass therethrough to impinge upon fiducial marks 40 and 42 to enable the method herein. In this case, donor element 16 can be placed on substrate 10 before performing the aligning process.

The support 68 can be made of any of several materials which meet at least the following requirements. The donor support must be sufficiently flexible and possess adequate tensile strength to tolerate precoating steps and roll-to-roll or stacked-sheet transport of the support in the practice of the invention. Support 68 must be capable of maintaining the structural integrity during the light-to-heat-induced transfer step while pressurized on one side, and during any preheating steps contemplated to remove volatile constituents such as water vapor. Additionally, support 68 must be capable of receiving on one surface a relatively thin coating of organic material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support material can require a multi-step cleaning and surface preparation process prior to precoating with transferable organic material. If the support material is a radiation-transmissive material, the incorporation into the support or onto a surface thereof, of a radiation-absorptive material can be advantageous to more effectively heat the donor support and to provide a correspondingly enhanced transfer of transferable organic donor material from the support to the substrate, when using a flash of radiation from a suitable flash lamp or laser light from a suitable laser.

Energy-absorbing layer 70 is capable of absorbing radiation in a predetermined portion of the spectrum and producing heat. Energy-absorbing layer can be a dye such as the dyes specified in commonly assigned U.S. Pat. No. 5,578,416, a pigment such as carbon, or a metal such as nickel, chromium, titanium, etc.

A typical OLED device can contain the following layers, usually in this sequence: an anode, a hole-injecting layer, a hole-transporting layer, a light-emitting layer, an electron-transporting layer, a cathode. Any or all of these can comprise organic material 72, thus forming an organic layer. Organic material 72 can be a hole-injecting material, a hole-transport material, an electron-transport material, an emissive material, a host material, or a combination of any of these materials.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

Hole-Transport (HT) Material

Hole-transport materials useful as organic material 72 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A).

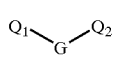

A wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula (A) and containing two triarylamine moieties is represented by structural Formula (B).

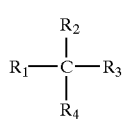

B where:
$R_1$ and $R_2$ each independently represents a hydrogen atom, an aryl group, or an alkyl group or $R_1$ and $R_2$ together represent the atoms completing a cycloalkyl group; and
$R_3$ and R4 each independently represents an aryl group, which is in turn substituted with a diaryl substituted amino group, as indicated by structural Formula (C).

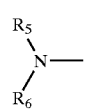

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D).

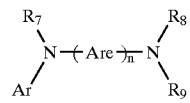

D wherein:
each Are is an independently selected arylene group, such as a phenylene or anthracene moiety;
n is an integer of from 1 to 4; and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene 2,6-Bis[N-(1-naphthyl)-N-(2-naphthyl)amino] naphthalene
N,N,N',N'-Tetra(2-naphthyl)-4,4'-diamino-p-terphenyl
4,4'-Bis{N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transport materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly (4-styrenesulfonate) also called PEDOT/PSS.

Light-Emitting Material

Light-emitting materials useful as organic material 72 are well known. As more fully described in U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

E

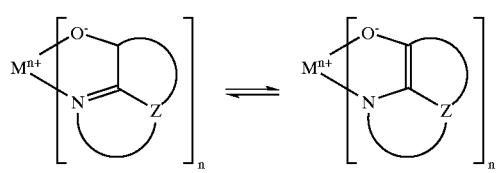

wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange, or red.

F

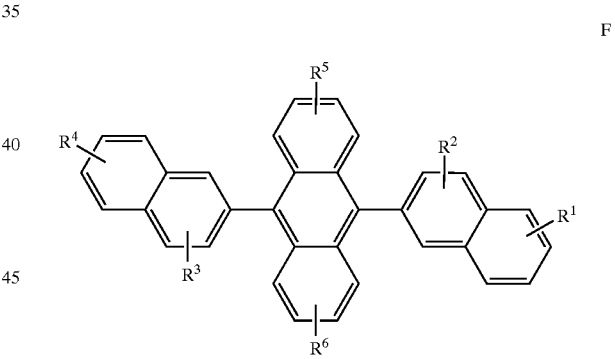

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange, or red.

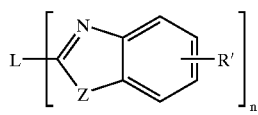

G where:

n is an integer of 3 to 8;

Z is O, NR or S;

R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)-tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1
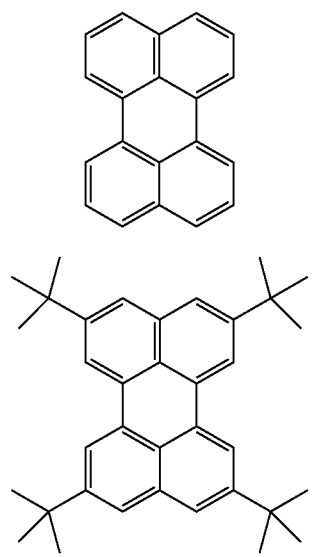

L2

L3
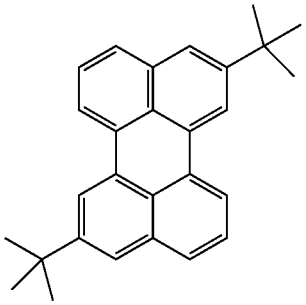

L4
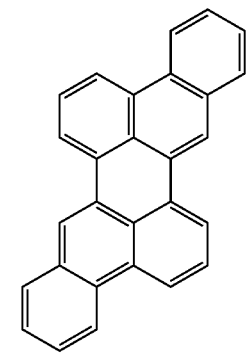

L5
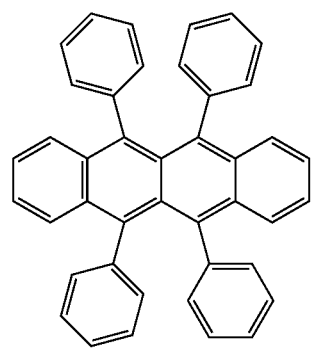

L6
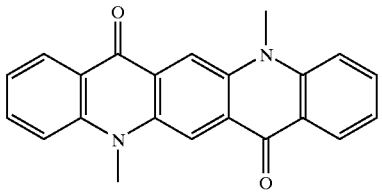

L7
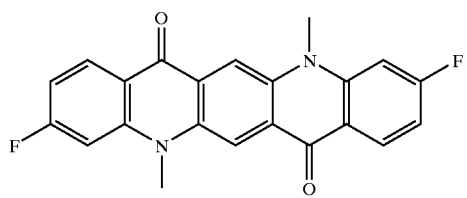

-continued

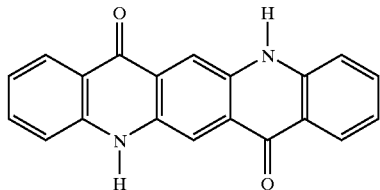
L8

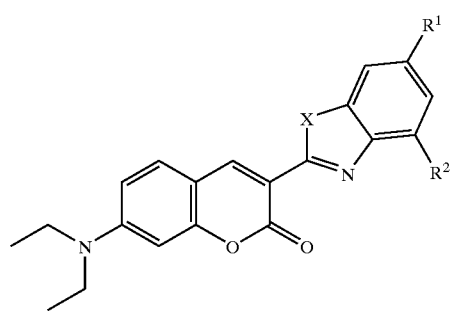

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

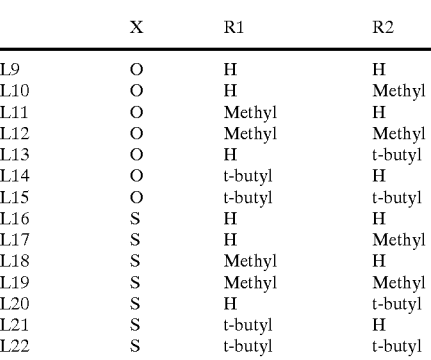

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

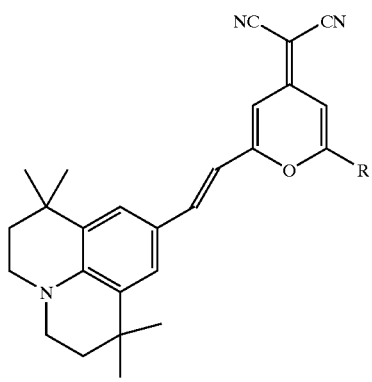

| | R |
|---|---|
| L37 | phenyl |
| L38 | methyl |
| L39 | t-butyl |
| L40 | mesityl |

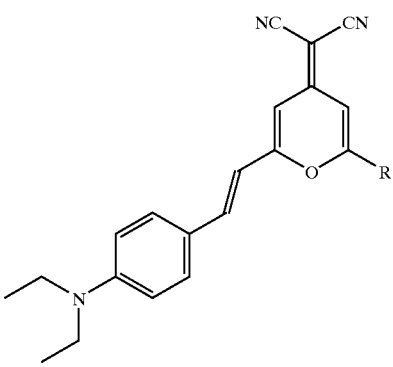

| | R |
|---|---|
| L41 | phenyl |
| L42 | methyl |
| L43 | t-butyl |
| L44 | mesityl |

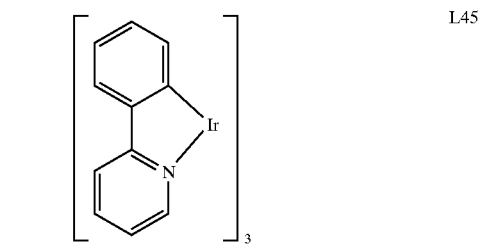
L45

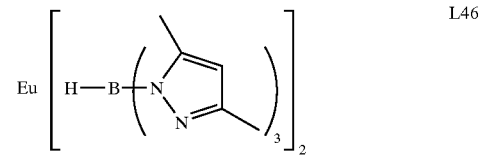
L46

-continued

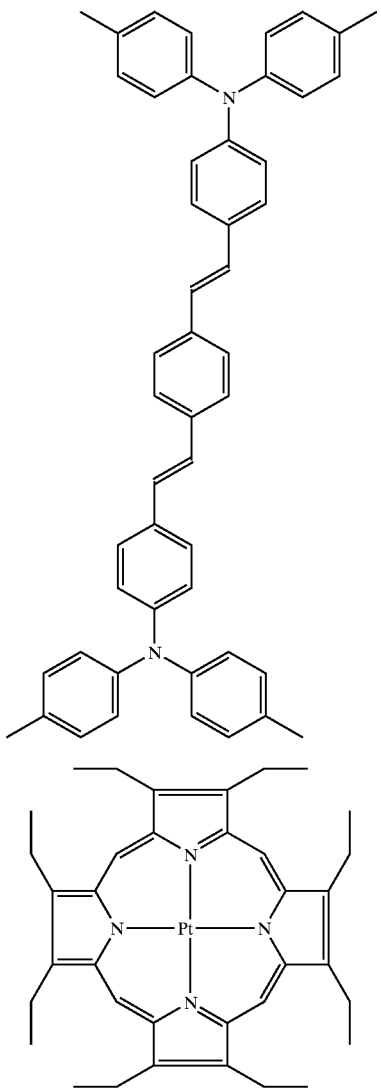

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein.

Electron-Transport (ET) Material

Preferred electron transport materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (G) are also useful electron transporting materials.

Other electron-transport materials can be polymeric substances, e.g. polyphenylenevinylene derivatives, poly-para-phenylene derivatives, polyfluorene derivatives, polythiophenes, polyacetylenes, and other conductive polymeric organic materials such as those listed in commonly assigned U.S. Pat. No. 6,221,553 B1 and references therein.

In some instances, a single layer can serve the function of supporting both light emission and electron transportation, and will therefore include emissive material and electron transport material.

Anode Material

The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum-or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well-known photolithographic processes.

Cathode Material

When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 5:
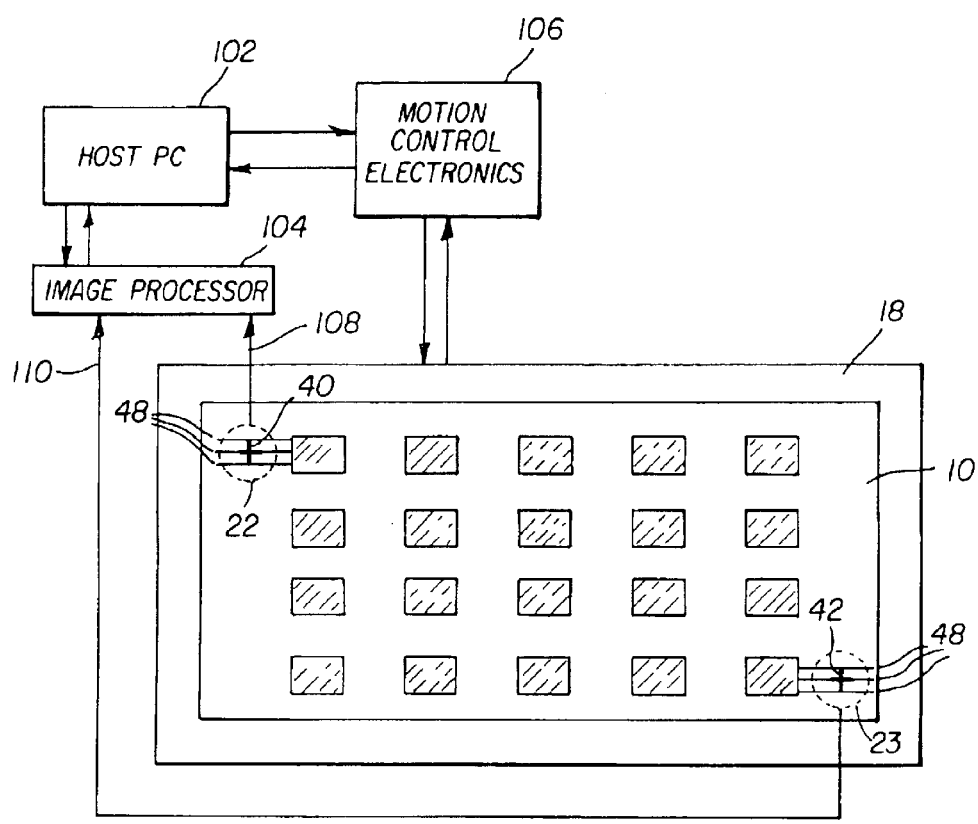
FIG. 5 shows a block diagram of the electrooptical subsystems which are used to process signals and detect and determine the positions of the fiducial marks.

FIG. 5 shows a block diagram of one embodiment of the electrooptical subsystems that are used to process signals and detect the positions of the fiducial marks. These subsystems include host PC 102, image processor 104, and motion control electronics 106. These can be separate units, or image processor 104 or motion control electronics 106 or both can be incorporated into host PC 102. Host PC 102 communicates with image processor 104, and allows the host PC to measure the light level incident on light detectors 22 and 23. Image processor 104 amplifies signal 108 provided by light detector 22 and amplifies signal 110 provided by light detector 23. Image processor 104 provides such amplified signals to host PC 102. Host PC 102 can use such amplified signals to compute information from the detection of fiducial marks such as 40 to determine the position and orientation of substrate 10. Host PC 102 is also connected to motion control electronics 106, which controls the motion and position of the translation and rotation stages that comprise apparatus 18. This provides the relative motion between the laser 100 and the substrate 10, which thereby provides for laser spot scans 48 on substrate 10. By providing for such relative motion, laser beam 74 can be scanned over a portion of substrate 10 that includes fiducial mark 40 and light detector 22. Relative motion can than be provided in a direction perpendicular to laser spot scan 48 and the process repeated. During this time, the output from light detector 22 can be monitored and correlated with position information from motion control electronics 106. In such a manner, image processor 104 can build a raster image of the position of fiducial mark 40. By a similar process, a raster image of the position of fiducial mark 42 can be obtained at light detector 23.

Figure 6:
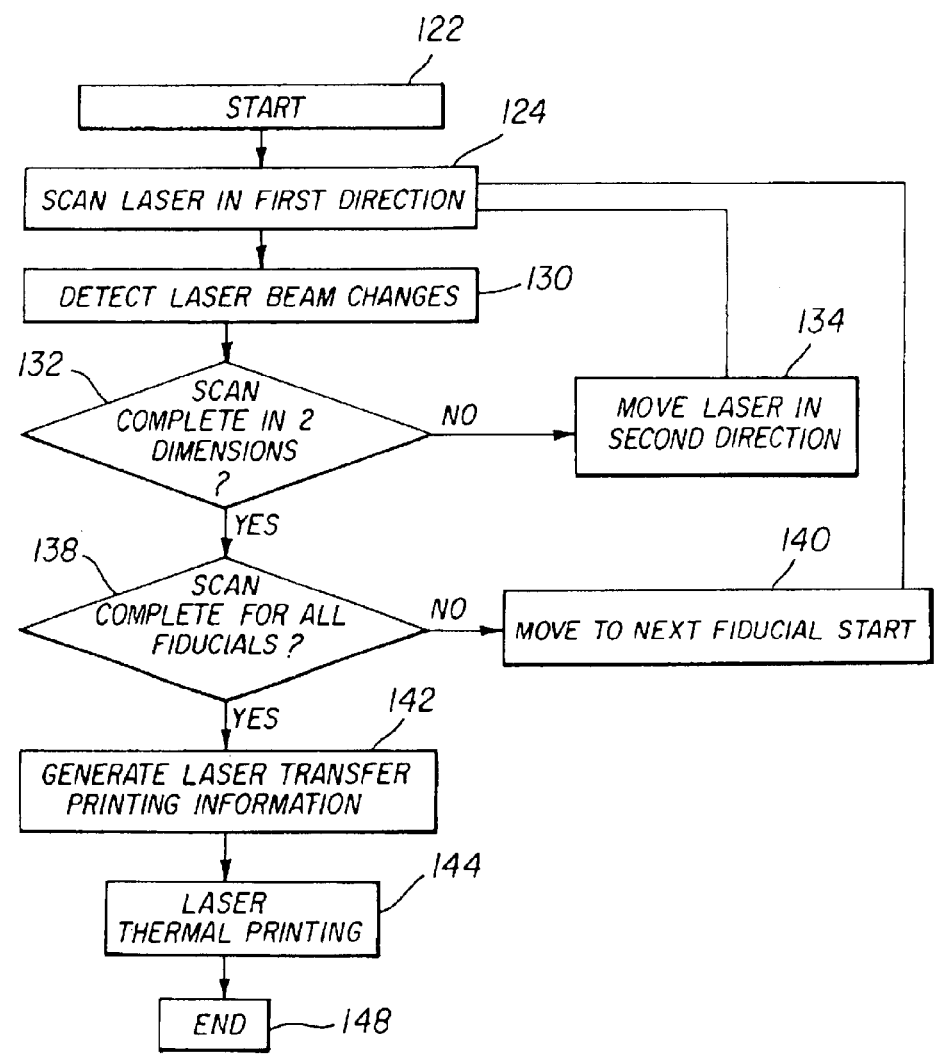
FIG. 6 is a block diagram showing the overall steps in detecting the positions of the fiducial marks.

FIG. 6 is a block diagram showing the overall steps in detecting the positions of the fiducial marks using two such marks and in aligning a substrate for use in manufacture of OLED displays. The process begins with placing a substrate with fiducial marks on the translation/rotation stage (Step 122). Relative motion is provided such that the laser is scanned in a first direction over the region of the light detector where the fiducial mark is approximately located (Step 124). The incident intensity is measured by image processor 104 and host PC 102 to yield an intensity versus position along the scan, as shown in FIG. 2 (detecting Step 130). Host PC 102 determines if the scan is the last scan over the light detector (Step 132). If the last scan has not been reached, the translation stage is advanced perpendicular to the scan direction (Step 134) and the process is repeated. If the scanning of the light detector is complete (Step 132), then the host PC determines if there are more fiducial marks to be scanned (Step 138). If there are more fiducials, relative motion is provided to move the laser beam to the start of the next fiducial mark (Step 140) and the scanning is repeated (Step 124 and following). If the last fiducial has been scanned, host PC 102 determines the absolute translational and angular position of the fiducial marks, as described in commonly assigned U.S. patent application Ser. No. 10/184,417 filed Jun. 27, 2002 by Andrea S. Rivers et al., entitled "Depositing an Emissive Layer for Use in an Organic Light-Emitting Display Device (OLED)", the disclosure of which is herein incorporated by reference.

For example, the position and orientation of substrate 10 can be determined based on information computed from the detection of fiducial marks such as 40 and 42. If there is any misalignment, then using the known locations of the fiducial marks the rotation and translation stages are adjusted, the image file is adjusted, the start of image is adjusted or some combination of these actions is done to allow the image to be laser transferred at precise locations (Step 142). Such actions can include mechanical or digital translation, mechanical or digital rotation, and mechanical or digital stretching of the image to be transferred. Such methods are well-known in the art. The transfer is conducted by placing a donor sheet in a transfer relationship relative to the substrate 10 and providing relative movement between laser beam 74 and substrate 10, and activating laser beam 74 in accordance with the determined position and orientation of substrate 10 to cause the transfer of organic material 72 from donor element 16 onto substrate 10 at the desired positions, e.g. pixel portions 12. Laser beam 74 can be activated according to timing or according to position (Step 144). A method for placing a donor in such a transfer relationship has been described in commonly assigned U.S. patent application Ser. No. 10/021,410 filed Dec. 12, 2001 by Bradley A. Phillips et al., entitled "Apparatus for Permitting Transfer of Organic Material From a Donor to Form a Layer in an OLED Device", the disclosure of which is herein incorporated by reference. A method for transferring material from the donor to the substrate has been described in commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer", the disclosure of which is herein incorporated by reference. The process is then ended (Step 148).

The invention has been described in detail with particular reference to certain preferred embodiments thereof, but it will be understood that variations and modifications can be effected within the spirit and scope of the invention.

Parts List 10 substrate
12 pixel portion
14 material transfer area
16 donor element
18 apparatus
20 laser spot
22 light detector
23 light detector
24 light detector active area
26 fiducial center
30 y-axis translation stage
32 x-axis translation stage
34 rotation stage
36 hold-down platen
40 fiducial mark
42 fiducial mark
44 signal strength
46 relative light detector position
48 laser spot scan
50 light detector signal intensity
68 support
70 energy-absorbing layer
72 organic material
74 laser beam
76 non-transfer surface
78 transfer surface
82 organic layer
94 print lens Parts List (con't)

96 pressurizing means
100 laser
102 host PC
104 image processor
106 motion control electronics
108 signal
110 signal
122 block
124 block
130 detecting step 132 photodetector
134 scan direction
138 block
140 block
142 block
144 block
148 block

What is claimed is:

1. A method of aligning a substrate for use in manufacture of OLED displays with a laser which produces a beam that causes the transfer of organic material from a donor element to the substrate, comprising the steps of:
   a) providing at least one fiducial mark on the substrate;
   b) positioning the substrate relative to the laser and providing relative movement between the substrate and the laser and the laser beam until the laser beam impinges upon the fiducial mark; and
   c) detecting when the laser beam impinges upon the fiducial mark and determining the position and orientation of the substrate.

2. The method of claim 1 wherein the fiducial mark has a specified shape.

3. The method of claim 2 wherein the specified shape is a cross.

4. The method of claim 2 wherein when the laser beam impinges upon the fiducial mark in multiple locations, information is recorded and using such recorded information to calculate the orientation of the substrate.

5. A method of aligning a substrate and making OLED displays with a laser which produces a beam that causes the transfer of organic material from a donor element to the substrate, comprising the steps of:
   a) providing at least one fiducial mark on the substrate;
   b) positioning the substrate relative to the laser and providing relative movement between the substrate and the laser and the laser beam until the laser beam impinges upon the fiducial mark;
   c) detecting when the laser beam impinges upon the fiducial mark and determining the position and orientation of the substrate; and
   d) providing relative movement between the laser beam and the substrate and activating the laser beam in accordance with the determined position and orientation of the substrate to cause the transfer of organic material from the donor element onto the substrate.

6. The method of claim 5 wherein the fiducial mark has a specified shape.

7. The method of claim 6 wherein the specified shape is a cross.

8. The method of claim 6 wherein when the laser beam impinges upon the fiducial mark in multiple locations, information is recorded and using such recorded information to calculate the orientation of the substrate.

9. The method of claim 5 further including providing a laser which produces the laser beam used in steps b) and d).

10. A method of aligning a substrate and making OLED displays with a laser which produces a beam that causes the transfer of organic material from a donor element to the substrate, comprising the steps of:
    a) providing at least two fiducial marks, each such mark having a specified shape, on the substrate;
    b) positioning the substrate relative to the laser and providing relative movement between the substrate and the laser and the laser beam until the laser beam impinges upon a fiducial mark;
    c) detecting when the laser beam impinges upon the fiducial marks and determining the position and orientation of the substrate based upon information computed from the detection of such fiducial marks; and
    d) providing relative movement between the laser beam and the substrate and activating the laser beam in accordance with the determined position and orientation of the substrate to cause the transfer of organic material from the donor element onto the substrate.

11. The method of claim 10 wherein the fiducial mark has a specified shape.

12. The method of claim 11 wherein the specified shape is a cross.

13. The method of claim 10 wherein when the laser beam impinges upon the fiducial mark in multiple locations, information is recorded and such recorded information is used to calculate the orientation of the substrate.

14. The method of claim 10 wherein the two fiducial marks are positioned outside the area where the organic material is to be transferred onto the substrate to form one or more OLED displays.

15. The method of claim 10 wherein the detecting step includes providing a light detector either above or below the substrate and amplifying the signal provided by the light detector and using such amplified signals to compute information from the detection of such fiducial marks to determine the position and orientation of the substrate.

16. A method of aligning a substrate and making OLED displays with a laser which produces a beam that causes the transfer of organic material from a donor element to the substrate, comprising the steps of:
    a) providing at least one fiducial mark on the substrate;
    b) positioning the substrate relative to the laser and providing relative movement between the substrate and the laser and the laser beam until the laser beam impinges upon the fiducial mark;
    c) detecting when the laser beam impinges upon the fiducial mark and determining the position and orientation of the substrate;
    d) positioning the donor element between the laser and the substrate; and
    e) providing relative movement between the laser beam and the substrate and activating the laser beam in accordance with the determined position and orientation to cause the transfer of organic material onto the substrate.

17. The method of claim 16 wherein the fiducial mark has a specified shape.

18. The method of claim 17 wherein the specified shape is a cross.

19. The method of claim 16 wherein when the laser beam impinges upon the fiducial mark in multiple locations, information is recorded and such recorded information is used to calculate the orientation of the substrate.

20. The method of claim 16 wherein the donor element permits sufficient light to pass therethrough to impinge upon the fiducial mark.

21. The method of claim 16 wherein the detecting step includes providing a light detector either above or below the substrate and amplifying the signal provided by the light detector and using such amplified signals to compute information from the detection of such fiducial marks to determine the position and orientation of the substrate.

* * * * *